(12) United States Patent
Takeda (10) Patent No.: US 7,847,585 B2
(45) Date of Patent: Dec. 7, 2010

(54) SOURCE FOLLOWER WITH ACTIVE INDUCTANCE AS A LOAD

(75) Inventor: Kanji Takeda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/465,837

(22) Filed: May 14, 2009

(65) Prior Publication Data
US 2009/0284280 A1    Nov. 19, 2009

(30) Foreign Application Priority Data
May 16, 2008    (JP)    ............................. 2008-129630

(51) Int. Cl.
*H03K 19/003*    (2006.01)
(52) U.S. Cl. .......................................... 326/30; 326/34
(58) Field of Classification Search ................ 326/21, 326/26–27, 30–31, 34
See application file for complete search history.

(56) References Cited

U.S. PATENT DOCUMENTS

| | | | | |
|---|---|---|---|---|
| 7,049,888 B2 * | 5/2006 | Soda | ........................ | 330/253 |
| 7,177,612 B2 * | 2/2007 | Nakamura et al. | .......... | 455/265 |
| 7,339,436 B2 * | 3/2008 | Fu et al. | ..................... | 330/294 |
| 2004/0227573 A1 | 11/2004 | Soda | | |

FOREIGN PATENT DOCUMENTS

| | | |
|---|---|---|
| JP | 2004-343373 | 12/2004 |
| JP | 2006-254303 | 9/2006 |

OTHER PUBLICATIONS

Xianping Fan et al., "Analysis and Design of Low-Distortion CMOS Source Followers", IEEE Transactions on Circuits and System, vol. 52, No. 8, Aug. 2005, pp. 1489-1501.

* cited by examiner

*Primary Examiner*—James Cho
(74) *Attorney, Agent, or Firm*—Young & Thompson (57) ABSTRACT

A semiconductor integrated circuit device comprises a transistor circuit exhibiting inductance at a desired frequency owing to capacitance between electrodes in a MOS transistor, the transistor circuit having an impedance that increases with an increase in frequency; and a first MOS transistor that functions as a source follower having the transistor circuit as a load.

6 Claims, 8 Drawing Sheets

SOURCE FOLLOWER WITH ACTIVE INDUCTANCE AS A LOAD

REFERENCE TO RELATED APPLICATION

This application is based upon and claims the benefit of the priority of Japanese patent application No. 2008-129630, filed on May 16, 2008, the disclosure of which is incorporated herein in its entirety by reference thereto.

TECHNICAL FIELD

This invention relates to a semiconductor integrated circuit device and, more particularly, to a semiconductor integrated circuit device functioning as a receiving circuit connected to a transmission line.

BACKGROUND

When serial signals are transmitted differentially, transmission-line loss increases with frequency and phase lag ascribable to the transmission line also increases with frequency. On the receiving side, therefore, the higher the frequency, the more jitter increases and the more the eye aperture ratio declines. Accordingly, Patent Document 1 discloses a signal transmission circuit equipped with an inductor having one end thereof connected to the receiving side of a transmission line and the other end thereof connected to a terminating resistor. In accordance with such a signal transmission circuit, phase lag of the transmission line is compensated for by the inductor, jitter can be reduced and the eye aperture ratio enlarged. Patent Document 1 describes that means such as a chip inductor or metal wiring is employed as the inductor.

A level shifter constituted by a transistor source follower is often used on the receiving side of differential transmission for the purpose of adjusting the common level of the receive differential signals. An example of a circuit in which the load of the source follower is a current source is described in Non-Patent Document 1 as the arrangement of the level shifter relaying upon the source follower.

Figure 8:
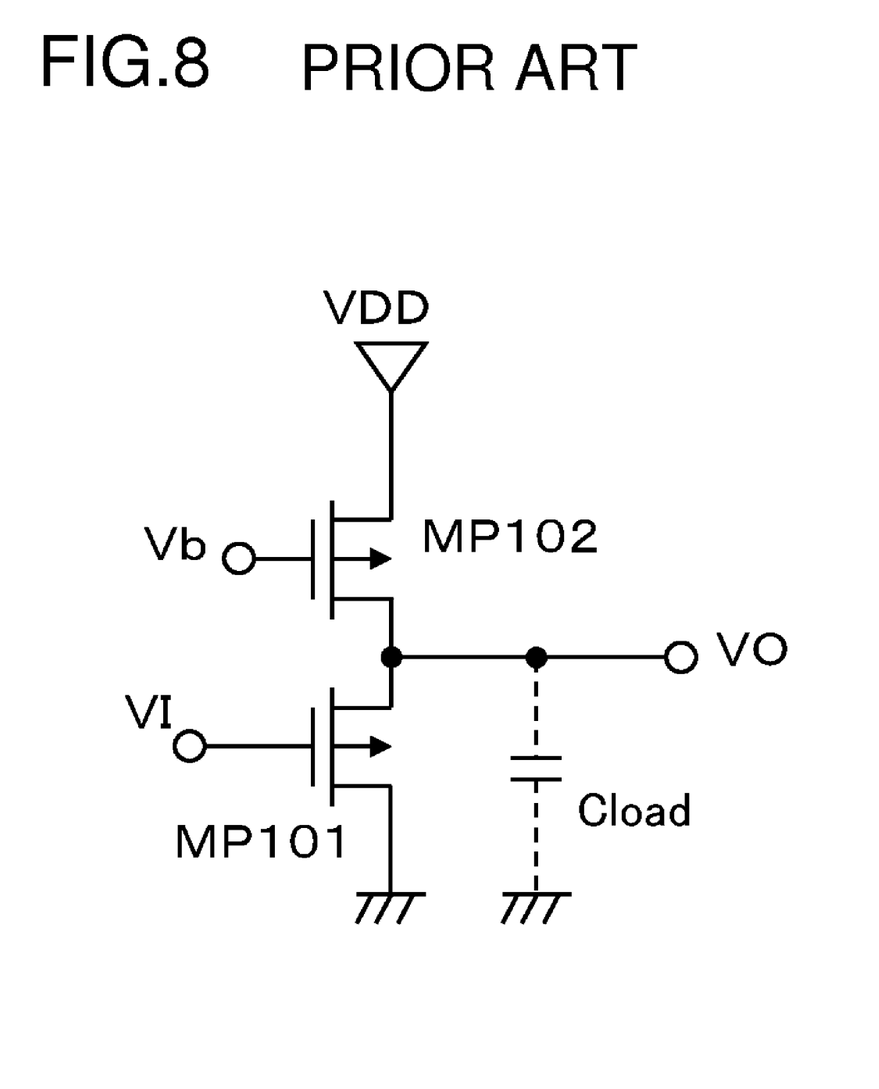
FIG. 8 is a typical example of the circuit diagram of a level shift circuit according to the prior art.

FIG. 8 is a typical example of the circuit diagram of a level shift circuit described in Non-Patent Document 1. As shown in FIG. 8, a PMOS transistor MP101 has a gate to which an input signal VI is supplied, a drain connected to ground and a source connected to the drain of a PMOS transistor MP102 and from which an output signal VO is produced. The PMOS transistor MP102 has a gate to which a bias voltage Vb is applied and a source connected to a power supply VDD. A capacitance element Cload represents a load capacitance connected to the source of the PMOS transistor MP101.

Related Patent Document 2 describes an active inductance circuit having a small number of elements and capable of low-voltage operation. The active inductance circuit includes a first transistor, a second transistor having a polarity different from that of the first transistor, a capacitor and a current source. A first signal terminal of the first transistor is connected to an output terminal, a control terminal of the second transistor is connected to the first signal terminal of the first transistor, a control terminal of the first transistor is connected to a second signal terminal of the second transistor, and the second signal terminal of the second transistor is connected to a terminal of the current source and to a terminal of the capacitor.

[Patent Document 1]
Japanese Patent Kokai Publication No. JP2006-254303A
[Patent Document 2]
Japanese Patent Kokai Publication No. JP2004-343373A
[Non-Patent Document 1]
Xianping Fan and P. K. Chan, "Analysis and Design of Low-Distortion CMOS Source Followers", IEEE Transactions on Circuit and System, Vol. 52, No. 8, August 2005, pp. 1489-1501

SUMMARY

The analysis below is given in the present invention.

The signal transmission circuit described in Patent Document 1 has a chip inductor or metal wiring. Accordingly, if the receiving circuit connected to the transmission line is constituted by a semiconductor integrated circuit device, the circuit is large in size, the manufacturing process is complicated and this leads to higher cost. Further, the signal transmission line does not have a level-shift function and the common level of the receive differential signals cannot be adjusted.

By contrast, the circuit described in Non-Patent Document 1 has a level-shift function but does not have a function that compensates for transmission-line loss. The frequency characteristic of the circuit shown in FIG. 8 will be explained. In FIG. 8, let gm0 represent the mutual conductance of the PMOS transistor MP101 and let Zs represent the parallel impedance of the output resistance of the PMOS transistor MP101, output resistance of the PMOS transistor MP102 and load capacitance Cload. Further, let rout represent the parallel resistance value of the output resistance of the PMOS transistor MP101 and output resistance of PMOS transistor MP102.

Small signal gain Av of the source-follower circuit of FIG. 8 is represented by the following equation:

$$Av = \frac{gm_0 \cdot Zs}{1 + gm_0 \cdot Zs}$$

and Zs is written as follows:

$$Zs = rout // \frac{1}{s \cdot Cload} = \frac{\frac{rout}{s \cdot Cload}}{rout + \frac{1}{s \cdot Cload}} = \frac{1}{s \cdot Cload + \frac{1}{rout}}$$

where $s = j\omega$ holds and $\omega$ is the angular frequency of the input signal.

Accordingly, the small signal gain Av can be written as follows:

$$Av = \frac{gm_0}{\frac{1}{Zs} + gm_0} = \frac{gm_0}{\left(s \cdot Cload + \frac{1}{rout}\right) + gm_0}$$

The small signal gain Av exhibits a low-pass filter characteristic; the higher the frequency, the lower the gain and the greater the phase lag.

As a consequence, if such a circuit is applied to the receiving circuit of a signal transmission, jitter increases and eye aperture ratio declines in high speed transmission and data reception with little error is difficult.

According to a first aspect of the present invention, there is provided a semiconductor integrated circuit device comprising: a transistor circuit exhibiting inductance at a desired frequency owing to capacitance between electrodes in a MOS transistor, the transistor circuit having an impedance that increases with an increase in frequency; and a first MOS transistor that functions as a source follower having the transistor circuit as a load.

According to a second aspect of the present invention, there is provided a receiving apparatus comprising a terminating resistor and the semiconductor integrated circuit devices according to the first aspect.

The meritorious effects of the present invention are summarized as follows.

In accordance with the present invention, the transistor circuit that becomes the load of the source follower exhibits inductance in a desired frequency band and impedance increases with an increase in frequency. Accordingly, a received signal can be level-shifted, jitter is improved and eye-pattern aperture ratio raised. This makes it possible to receive data with little error in transmission at higher speeds.

Other features and advantages of the present invention will be apparent from the following description taken in conjunction with the accompanying drawings, in which like reference characters designate the same or similar parts throughout the figures thereof.

PREFERRED MODES

A semiconductor integrated circuit device according to the present invention includes a transistor circuit (MN1 and R in FIG. 1, or MP2, MN2 and Is in FIG. 5) exhibiting inductance at a desired frequency owing to capacitance between electrodes in a MOS transistor, the transistor circuit having an impedance that increases with an increase in frequency; and a first MOS transistor (MP1 in FIG. 1) that functions as a source follower having the transistor circuit as a load.

The transistor circuit may be adapted to include a resistance element and a second MOS transistor, which has a conductivity type opposite that of the first MOS transistor, having a drain connected to a power supply, a gate connected to the power supply via the resistance element and a source connected to the source of the first MOS transistor.

Further, the transistor circuit may be adapted to include a second MOS transistor, which has a conductivity type identical with that of the first MOS transistor, having a source connected to a power supply and a drain connected to the source of the first MOS transistor; a third MOS transistor, which has a conductivity type opposite that of the first MOS transistor, having a drain connected to the power supply, a gate connected to the source of the first MOS transistor and a source connected to the gate of the second MOS transistor; and a current source connected to the source of the third MOS transistor.

Furthermore, a receiving apparatus according to the present invention comprises: a terminating resistor connected across both ends of a transmission line, which transmits differential signals, on a receiving side of the transmission line; and two of the above-described semiconductor integrated circuit device(s) in which first MOS transistors have gates, which are connected to respective ones of both ends of the terminating resistor, and sources serving as output terminals; differential receive signals being output from output terminals of respective ones of the two semiconductor integrated circuit devices.

In the semiconductor integrated circuit device set forth above, the source-follower-connected first MOS transistor functions as a level shifter. Furthermore, the transistor circuit that is the load of the source follower exhibits an inductance in a desired frequency band and the impedance thereof increases with an increase in frequency. By using this semiconductor integrated circuit device in a serial-signal receiving apparatus, therefore, the received signal can be level-shifted and it is possible to compensate for a deterioration in the frequency characteristic of the transmission line in the desired frequency band. Accordingly, jitter in the received signal is improved upon and eye-pattern aperture ratio in the received signal is improved.

Exemplary Embodiments of the present invention will now be described in detail with reference to the drawings.

First Exemplary Embodiment

Figure 1:
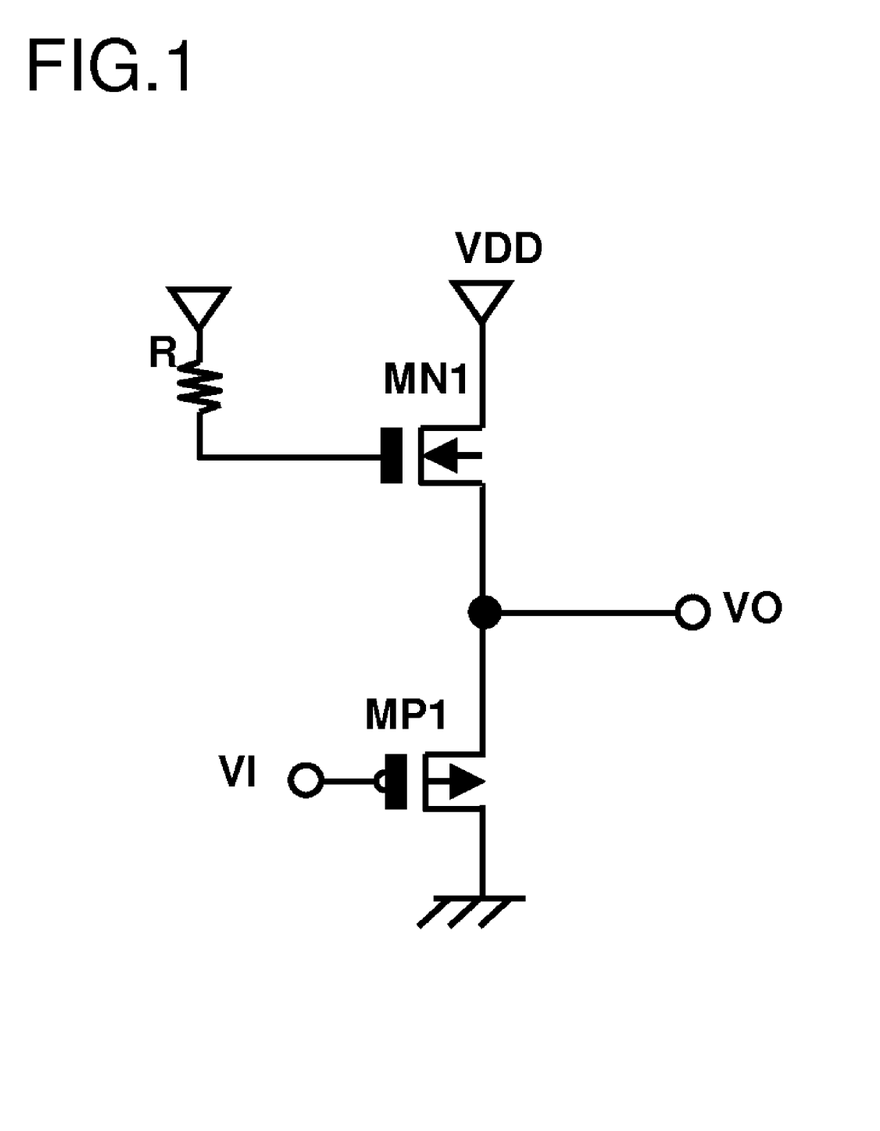
FIG. 1 is a circuit diagram of a semiconductor integrated circuit device according to a first exemplary embodiment of the present invention.

FIG. 1 is a circuit diagram of a semiconductor integrated circuit device according to a first exemplary embodiment of the present invention. As shown in FIG. 1, the semiconductor integrated circuit device includes a PMOS transistor MP1, an NMOS transistor MN1 and a resistance element R. The PMOS transistor MP1 has a gate to which an input signal VI is supplied, a drain connected to ground and a source connected to the source of the NMOS transistor MN1 and from which an output signal VO is output. The NMOS transistor MN1 has a gate connected to a power supply VDD via the resistance element R, a drain connected to the power supply VDD and a source connected to the source of the PMOS transistor MP1.

The semiconductor integrated circuit device thus constructed is such that the source-follower-connected PMOS transistor MP1 which functions as a level shifter, outputs the output signal VO obtained by level-shifting the input signal VI. Further, the NMOS transistor MN1 which acts as the load of the source follower exhibits inductance in a desired frequency band and has an impedance that increases with an increase in frequency.

Figure 2:
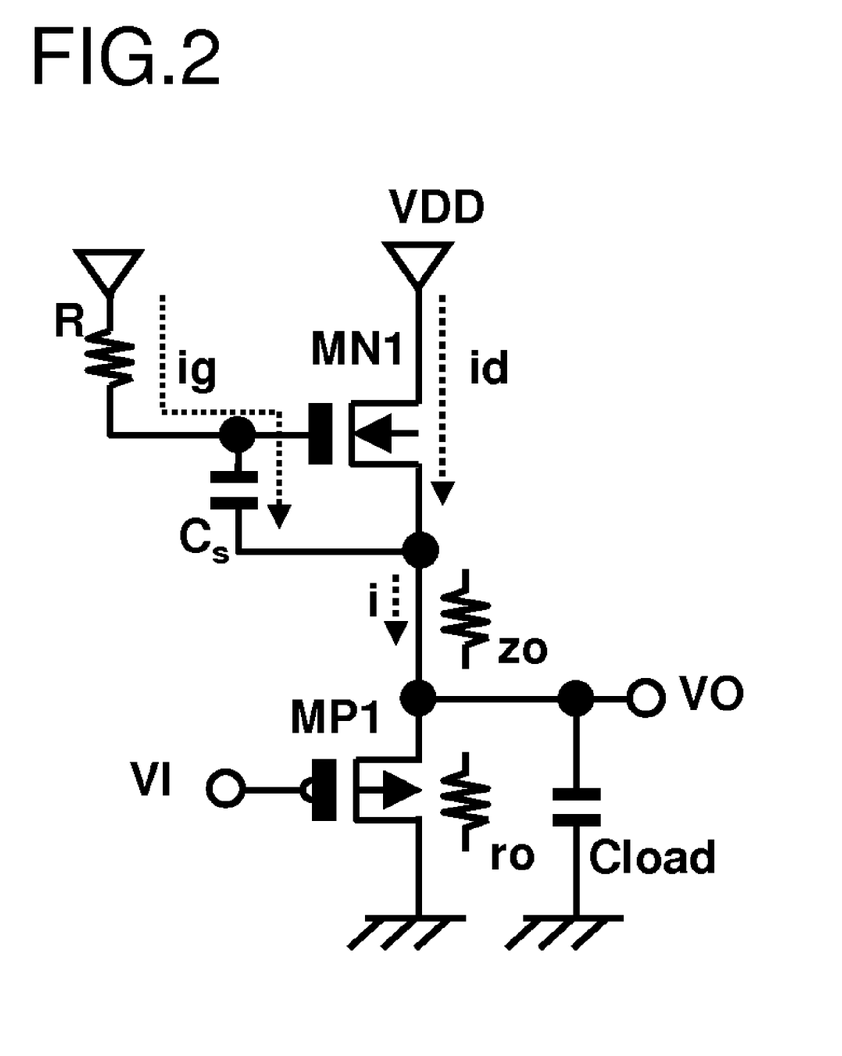
FIG. 2 is a diagram illustrating an equivalent circuit of a semiconductor integrated circuit device according to a first exemplary embodiment of the present invention.

Described next will be the fact that the load of the source follower exhibits inductance and has an impedance that increases. FIG. 2 is a diagram illustrating an equivalent circuit of the semiconductor integrated circuit device shown in FIG. 1. In FIG. 2, $C_s$, ro, zo and Cload represent parasitic capacitance between the gate and source of the NMOS transistor MN1, output resistance of the PMOS transistor MP1, impedance as seen from the source side of the NMOS transistor MN1, and load capacitance of the PMOS transistor MP1, respectively. Further, let gm0 represent the mutual conductance of the PMOS transistor MP1, and let gm1 represent the mutual conductance of the NMOS transistor MN1. Furthermore, let ig represent the current that flows into the parasitic capacitance Cs through the resistance element R, let id represent the current that flows into source of the NMOS transistor MN1 from the drain thereof and let i=ig+id hold.

If the voltage across the gate and source of the NMOS transistor MN1 is vgs, then we have $$id = gm_1 \times vgs$$

and vgs can be written as follows:

$$vgs = \frac{ig}{sC_s}$$

where s=jω and ω is the angular frequency of the input signal.

Accordingly, id can be written as follows:

$$id = \frac{gm_1 \times ig}{sC_s}$$

Further, if the voltage across the drain and source of the NMOS transistor MN1 is vds, then we have $$ig = \frac{vds}{\frac{1}{sC_s} + R}$$

Accordingly, we have the following:

$$i = ig + id$$
$$= ig + gm_1 \times \frac{ig}{sC_s}$$
$$= \frac{vds}{\frac{1}{sC_s} + R} + \frac{\frac{gm_1}{sC_s} \times vds}{\frac{1}{sC_s} + R}$$

$$\frac{i}{vds} = \frac{1 + \frac{gm_1}{sC_s}}{\frac{1}{sC_s} + R}$$

and zo can be written as follows $$zo = vds/i$$
$$= \left(R + \frac{1}{sC_s}\right) \Big/ (gm_1/sC_s + 1)$$
$$= \frac{R \cdot C_s \cdot s + 1}{C_s \cdot s + gm_1}$$

Under the condition that R>>1/gm1 holds, zo increases with an increase in frequency.

On the other hand, if we let Zs represent impedance as seen from the output side of the semiconductor integrated circuit device, then Zs is a parallel connection of ro, zo and Cload. Accordingly, we write the following:

$$Zs = ro \,//\, zo \,//\, \frac{1}{sCload}$$
$$= \frac{ro \cdot (R \cdot C \cdot s + 1)}{(R + ro) \cdot C_s \cdot s + (gm_1 \cdot ro + 1)} \,//\, \frac{1}{sCload}$$
$$= \frac{ro \cdot (R \cdot C_s \cdot s + 1)}{(ro \cdot R \cdot C_s \cdot Cload) \cdot s^2 + [ro \cdot Cload + (R + ro) \cdot C_s] \cdot s + (gm_1 \cdot ro + 1)}$$

Gain AV of the source follower, therefore, is expressed by the following equation:

$$Av = \frac{gm_0 \cdot Rs}{1 + gm_0 \cdot Rs}$$

$$= \frac{gm_0 \cdot ro \cdot (R \cdot C_s \cdot s + 1)}{(ro \cdot R \cdot C_s \cdot Cload) \cdot s^2 + [gm_0 \cdot ro \cdot R \cdot C_s + ro \cdot Cload + (R + ro) \cdot C_s] \cdot s + (gm_0 \cdot ro + gm_1 \cdot ro + 1)}$$

Figure 3:
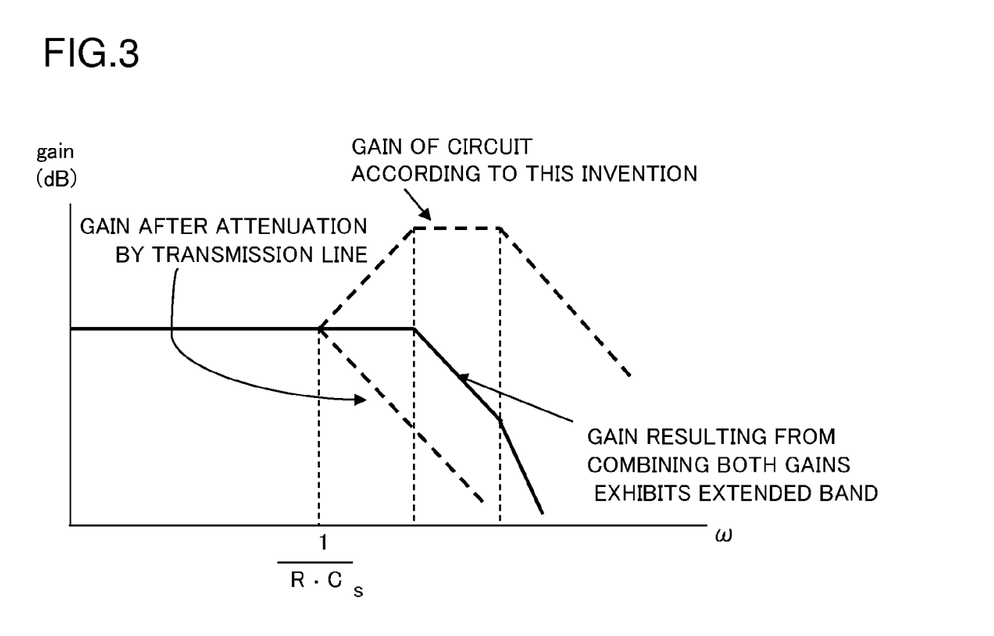
FIG. 3 is a diagram schematically illustrating a compensation characteristic in a semiconductor integrated circuit device according to a first exemplary embodiment of the present invention.

FIG. 3 is a diagram schematically illustrating a compensation characteristic in the semiconductor integrated circuit device according to the first exemplary embodiment of the present invention. FIG. 3 indicates that if the semiconductor integrated circuit device of this exemplary embodiment is used on the receiving side of a transmission line, gain that has been attenuated by the transmission line will be compensated for by the gain Av of the source follower, thereby extending the band to the high-frequency region.

Figure 4:
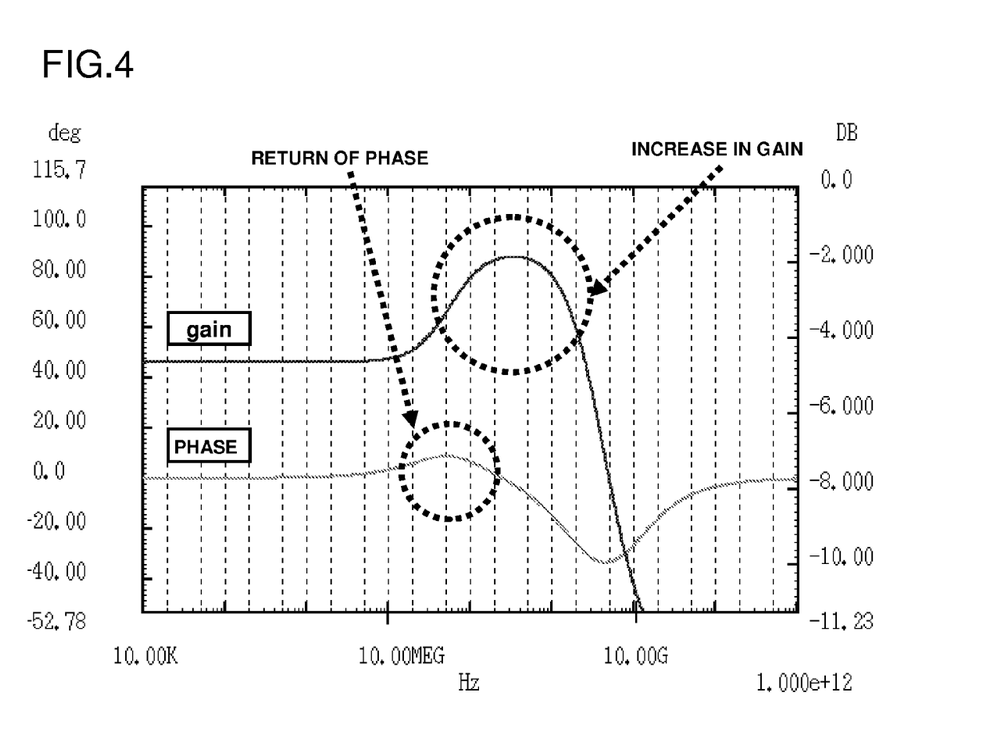
FIG. 4 is a diagram illustrating an example of a gain characteristic obtained by a simulation.

By way of example, assume that the following values hold: gm0=1.93 m$\Omega^{-1}$, gm1=1.22 m$\Omega^{-1}$, ro=8 k$\Omega$, R=100 k$\Omega$, Cload=100 fF, Cs=50 fF. FIG. 4 illustrates the frequency characteristic of gain Av obtained by performing a simulation under these conditions. In FIG. 4, a return of phase occurs at frequencies of about 20 to 200 MHz, i.e., inductance is manifested, and the graph indicates that gain increases at frequencies of about 50 MHz to 2 GHz.

If the semiconductor integrated circuit device described above is used in a receiving apparatus, the received signal is level-shifted and it is possible to compensate for a deterioration in the frequency characteristic of a transmission line in a desired frequency band.

Second Exemplary Embodiment

Figure 5:
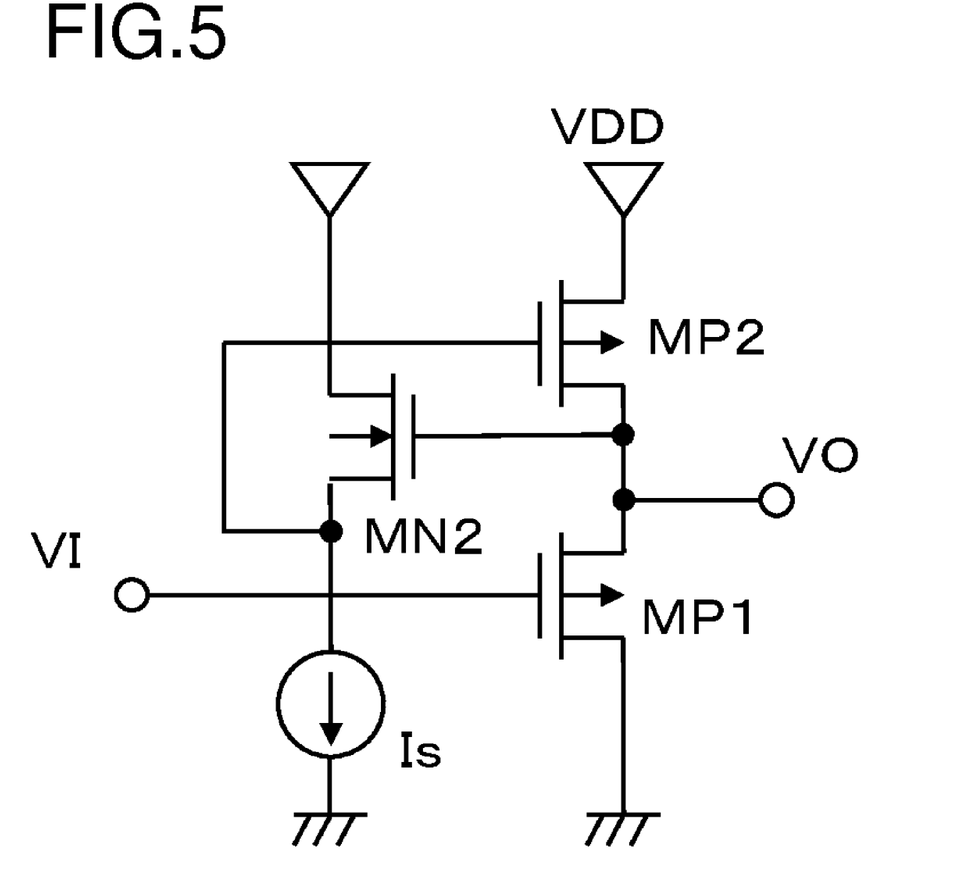
FIG. 5 is a circuit diagram of a semiconductor integrated circuit device according to a second exemplary embodiment of the present invention.

FIG. 5 is a circuit diagram of a semiconductor integrated circuit device according to a second exemplary embodiment of the present invention. As shown in FIG. 5, the semiconductor integrated circuit device includes PMOS transistors MP1 and MP2, an NMOS transistor MN2 and a current source Is. The PMOS transistor MP1 has a gate to which input signal VI is supplied, a drain connected to ground and a source connected to the drain of the PMOS transistor MP2, from which output signal VO is output. The PMOS transistor MP2 has a source connected to power supply VDD and a gate connected to the source of the NMOS transistor MN2 and to one end of the current source Is, the other end of which is grounded. The NMOS transistor MN2 has a drain connected to the power supply VDD and a gate connected to the drain of PMOS transistor MP2.

The semiconductor integrated circuit device thus constructed is such that the source-follower-connected PMOS transistor MP1, which functions as a level shifter, outputs the output signal VO obtained by level-shifting the input signal VI. Further, the transistor circuit which is the load of the source follower and which comprises the PMOS transistor MP2, NMOS transistor MN2 and current source Is corresponds to the active inductance circuit described in Patent Document 2, exhibits inductance in the desired frequency band and has an impedance that increases with an increase in frequency. If this semiconductor integrated circuit device is used in a receiving apparatus, the received signal is level-shifted and it is possible to compensate for a deterioration in the frequency characteristic of a transmission line in a desired frequency band in a manner similar to the first exemplary embodiment.

Third Exemplary Embodiment

Figure 6:
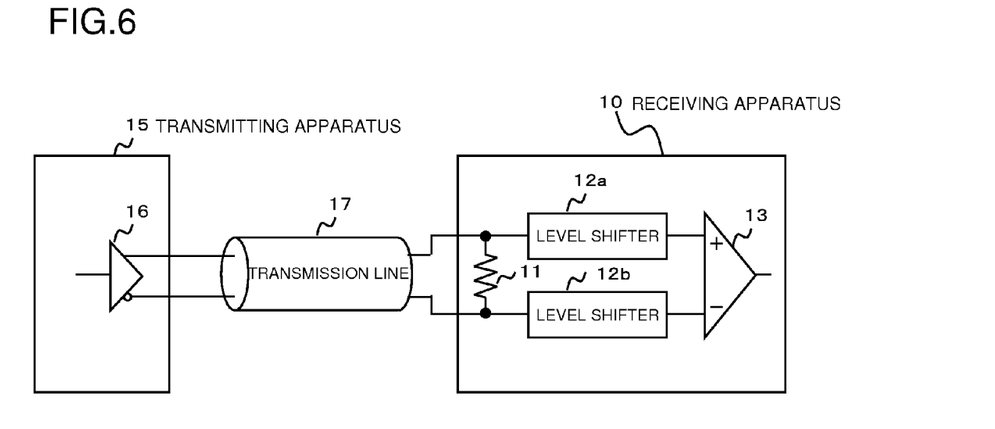
FIG. 6 is a block diagram illustrating the configuration of a receiving apparatus according to a third exemplary embodiment of the present invention.

FIG. 6 is a block diagram illustrating the configuration of a receiving apparatus 10 according to a third exemplary embodiment of the present invention. As shown in FIG. 6, the receiving apparatus 10 includes a terminating resistor 11, level registers 12a, 12b and an input buffer 13. The level shifters 12a, 12b each correspond to the semiconductor integrated circuit device described in the first or second exemplary embodiment. Differential signals that have been output from an output buffer 16 within a transmitting apparatus 15 and received via a transmission line 17 are terminated at the terminating resistor 11. The differential signals are level-shifted and have their frequency characteristics compensated for by the level shifters 12a, 12b connected to respective ones of both ends of the terminating resistor 11, and are output upon being buffered by the input buffer 13.

The receiving apparatus thus constructed utilizes the semiconductor integrated circuit devices, which have been described in the first or second exemplary embodiment, as the level shifters 12a and 12b. In the receiving apparatus 10, therefore, the differential signals, which are received serial signals, are each level-shifted and a deterioration in the frequency characteristic of the transmission line is compensated for in the desired frequency band.

Figure 7A:
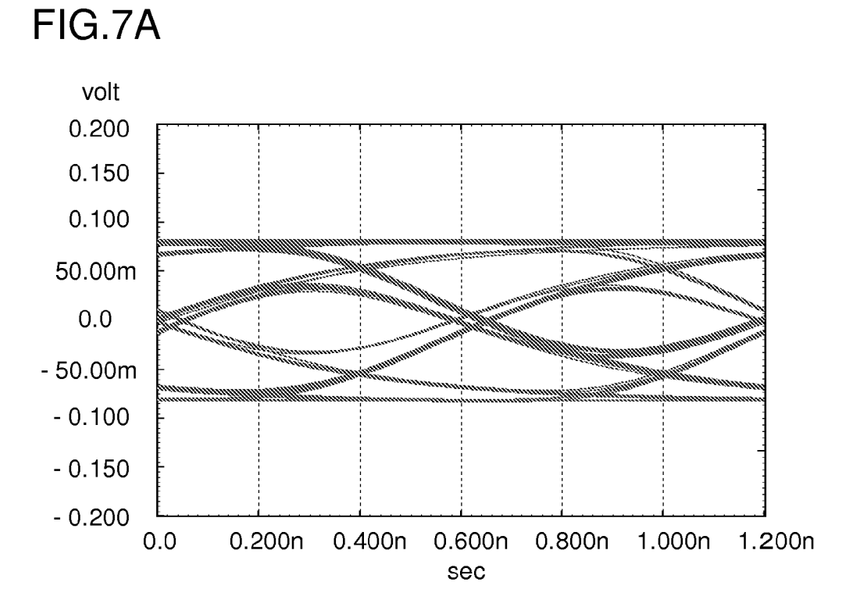
FIGS. 7A and 7B are diagrams illustrating examples of eye patterns obtained by simulations.
Figure 7B:
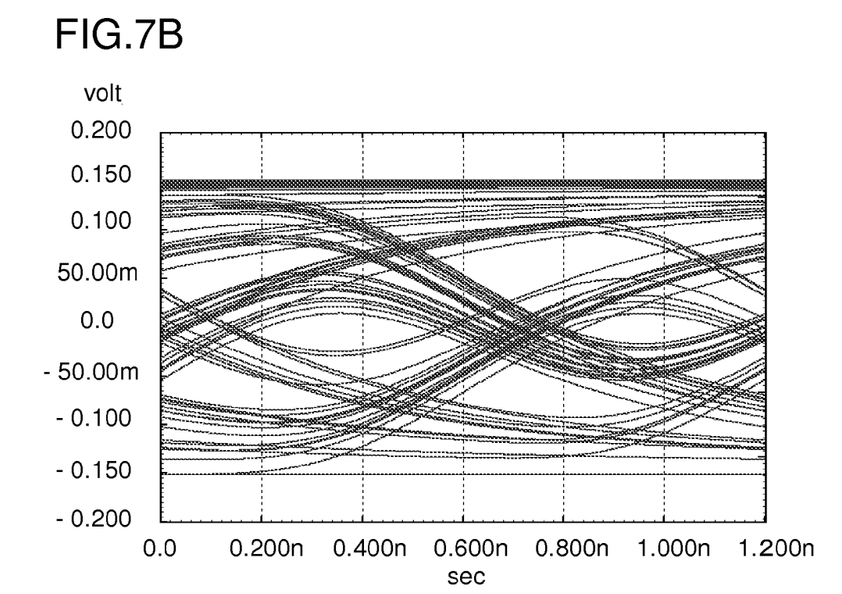

FIGS. 7A and 7B are diagrams illustrating examples of eye patterns of the output signal from the input buffer 13 according to simulation. FIG. 7B illustrates a comparative eye pattern in a case where a signal that results when a 1.6-Gbps signal has been attenuated by a transmission line is received by a comparative example of the source follower according to the prior art shown in FIG. 8, and FIG. 7A illustrates an eye pattern when this attenuated signal is received by the source follower of this exemplary embodiment. FIGS. 7A and 7B indicate that jitter in the received signal has been improved from about 300 ps to about 90 ps and that the eye-pattern aperture ratio of the received signal has been improved in the instant exemplary embodiment. Thus, the receiving apparatus according to this exemplary embodiment makes it possible to receive data with little error in transmissions at higher speeds.

The disclosures of the patent and non-patent documents cited above are incorporated by reference thereto in this specification. Within the bounds of the full disclosure of the present invention (inclusive of the scope of the claims), it is possible to modify and adjust the modes and exemplary embodiments of the invention based upon the fundamental technical idea of the invention. Multifarious combinations and selections of the various disclosed elements are possible within the bounds of the scope of the claims of the present invention. That is, it goes without saying that the invention covers various modifications and changes that would be obvious to those skilled in the art within the scope of the claims.

What is claimed is:

1. A semiconductor integrated circuit device, comprising:
a transistor circuit exhibiting inductance at a desired frequency owing to capacitance between electrodes in a MOS transistor, said transistor circuit having an impedance that increases with an increase in frequency; and
a first MOS transistor that functions as a source follower having said transistor circuit as a load,
wherein said transistor circuit includes,
a resistance element, and
a second MOS transistor, which has a conductivity type opposite that of said first MOS transistor, having a drain connected to a power supply, a gate connected to the power supply via said resistance element and a source connected to the source of said first MOS transistor.

2. A receiving apparatus comprising:
a terminating resistor connected across both ends of a transmission line, which transmits differential signals, on a receiving side of the transmission line; and
two of said semiconductor integrated circuit device set forth in claim 1, wherein the gates of said first MOS transistors are connected to respective ones of both ends of said terminating resistor, and the sources of said first MOS transistors serve as output terminals;
wherein differential receive signals are output from output terminals of respective ones of the two semiconductor integrated circuit devices.

3. A semiconductor integrated circuit device, comprising:
a transistor circuit exhibiting inductance at a desired frequency owing to capacitance between electrodes in a MOS transistor, said transistor circuit having an impedance that increases with an increase in frequency; and
a first MOS transistor that functions as a source follower having said transistor circuit as a load,
wherein said transistor circuit includes,
a second MOS transistor, which has a conductivity type identical with that of said first MOS transistor, having a source connected to a power supply and a drain connected to the source of said first MOS transistor,
a third MOS transistor, which has a conductivity type opposite that of said first MOS transistor, having a drain connected to the power supply, a gate connected to the source of said first MOS transistor and a source connected to the gate of said second MOS transistor, and
a current source connected to the source of said third MOS transistor.

4. A receiving apparatus comprising:
a terminating resistor connected across both ends of a transmission line, which transmits differential signals, on a receiving side of the transmission line; and
two of said semiconductor integrated circuit device set forth in claim 3, wherein the gates of said first MOS transistors are connected to respective ones of both ends of said terminating resistor, and the sources of said first MOS transistors serve as output terminals;
wherein differential receive signals are output from output terminals of respective ones of the two semiconductor integrated circuit devices.

5. A receiving apparatus comprising:
a terminating resistor connected across both ends of a transmission line, which transmits differential signals, on a receiving side of the transmission line; and
two of semiconductor integrated circuit devices, each comprising:
a transistor circuit exhibiting inductance at a desired frequency owing to capacitance between electrodes in a MOS transistor, said transistor circuit having an impedance that increases with an increase in frequency; and
a first MOS transistor that functions as a source follower having said transistor circuit as a load,
wherein the gates of said first MOS transistors are connected to respective ones of both ends of said terminating resistor, and the sources of said first MOS transistors serve as output terminals;
wherein differential receive signals are output from output terminals of respective ones of the two semiconductor integrated circuit devices.

6. The receiving apparatus according to claim 5, further comprising a receiving buffer circuit which receives said differential receive signals output from said output terminals, and outputs a resultant signal.

* * * * *